(12) United States Patent
Vernon (10) Patent No.: US 12,427,721 B2
(45) Date of Patent: Sep. 30, 2025

(54) SYSTEM, METHOD, AND COMPUTER PROGRAM FOR CREATING AN INTERNAL CONFORMING STRUCTURE

(71) Applicant: Honeywell Federal Manufacturing & Technologies, LLC, Kansas City, MO (US)

(72) Inventor: Gregory John Vernon, Kansas City, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 545 days.

(21) Appl. No.: 17/874,874

(22) Filed: Jul. 27, 2022

(65) Prior Publication Data

US 2022/0363049 A1 Nov. 17, 2022

Related U.S. Application Data

(62) Division of application No. 15/077,038, filed on Mar. 22, 2016, now Pat. No. 11,433,660.

(51) Int. Cl.
*B29C 64/386* (2017.01)
*B29C 64/118* (2017.01)
(Continued)

(52) U.S. Cl.
CPC .......... *B29C 64/386* (2017.08); *B29C 64/118* (2017.08); *B33Y 80/00* (2014.12); *B29L 2023/00* (2013.01)

(58) Field of Classification Search
CPC ............................. B29C 64/386; B29C 64/40
See application file for complete search history.

(56) References Cited

U.S. PATENT DOCUMENTS

| 4,168,944 A | 9/1979 | Morikawa et al. |
| 4,362,223 A | 12/1982 | Meier |
| (Continued) | | |

FOREIGN PATENT DOCUMENTS

| WO | 20130163398 | 10/2013 |
| WO | 2015006493 | 1/2015 |

OTHER PUBLICATIONS

International Search Report and Written Opinion in related application PCT/US2016/023623 mailed Dec. 22, 2016. 13 pages.
(Continued)

*Primary Examiner* — Matthew J Daniels
(74) *Attorney, Agent, or Firm* — Hovey Williams LLP (57) ABSTRACT

A system for creating an internal formation of a tubular structure having an inner surface via additive manufacturing. The system broadly includes a computer modeling system and an additive manufacturing system. The computer modeling system may include a processor for generating a lattice cellular component via computer-aided design software according to inputs received from a user. The processor may also generate an internal formation lattice structure based on the lattice cellular component and modify the lattice structure to follow and/or conform to the curvature of the inner surface of the outer wall of the tubular structure. The additive manufacturing system may be configured to produce the lattice structure and the tubular structure via additive manufacturing material deposited layer by layer according to the lattice structure.

20 Claims, 8 Drawing Sheets

(51) Int. Cl.
*B33Y 80/00* (2015.01)
*B29L 23/00* (2006.01)

(56) References Cited

U.S. PATENT DOCUMENTS

| | | | |
|---|---|---|---|
| 5,393,587 A * | 2/1995 | Machida | F15D 1/04 |
| | | | 428/116 |
| 6,246,784 B1 | 6/2001 | Summers et al. | |
| 8,922,552 B2 | 12/2014 | Rouet et al. | |
| 9,399,320 B2 | 7/2016 | Johnson et al. | |
| 9,472,017 B2 | 10/2016 | Kapoor et al. | |
| 9,863,716 B2 | 1/2018 | Kokas et al. | |
| 9,977,840 B2 | 5/2018 | Makeig | |
| 9,982,406 B2 | 5/2018 | Bradley et al. | |
| 2014/0255647 A1 * | 9/2014 | Johnson | B33Y 80/00 |
| | | | 428/116 |
| 2015/0193559 A1 * | 7/2015 | Musuvathy | G06F 30/17 |
| | | | 703/1 |
| 2015/0299054 A1 | 10/2015 | Ogunwumi et al. | |
| 2016/0133049 A1 * | 5/2016 | Hill | G06T 19/20 |
| | | | 700/98 |

OTHER PUBLICATIONS

Aidan Kurtz: "Intralattice User Documentation," Article, Nov. 14, 2015, Version 0.8.0—Beta, 33 pages, <https://intralattice.com/userdocs/>.

ADML@McGil: "IntraLattice," Jul. 3, 2015, Video, 15:24 minutes, 3 pages, <https://www.youtube.com/watch ?v=DQZeOC2mvtc>.

European Office Action received in application No. 16895661.3, mailed Dec. 20, 2021.

Hussein et al., Advanced lattice support structures for metal additive manufacturing (Year: 2016).

Jarvinen et al., Characterization of effect of support structures in laser additive manufacturing of stainless steal (Year: 2014).

Adam et al., Design for Additive Manufacturing—Element transitions and aggregated structures (Year: 2013).

Dynamic Behavior of Hybrid APM (Advanced Pore Morphology Foam) and Aluminum Foam Filled Structures; Metals; ISSN 2075-4701; <www.mdpi.com/journal/metals; Metals Jun. 20, 2012, 2, 211-218; doi: 10.3390/met2020211>.

* cited by examiner

SYSTEM, METHOD, AND COMPUTER PROGRAM FOR CREATING AN INTERNAL CONFORMING STRUCTURE

RELATED APPLICATIONS

The present patent application is a divisional patent application claiming priority benefit, with regard to all common subject matter, to U.S. patent application Ser. No. 15/077,038, entitled "SYSTEM, METHOD, AND COMPUTER PROGRAM FOR CREATING AN INTERNAL CONFORMING STRUCTURE", filed Mar. 22, 2016. The earlier-filed patent application is hereby incorporated by reference in its entirety into the present application.

STATEMENT REGARDING FEDERALLY-SPONSORED RESEARCH OR DEVELOPMENT

This invention was made with Government support under Contract No.: DE-NA0000622 awarded by the United States Department of Energy/National Nuclear Security Administration. The Government has certain rights in the invention.

BACKGROUND

Pipe and tube inserts, baffles, and other internal formations are often used for altering fluid dynamics and other properties within tubular structures. For example, mufflers often include baffles to dampen the sound of exhaust, and catalytic converters and heat changers often include internal formations for changing fluid flow from laminar to turbulent flow. Such internal formations do not conform to curvatures of the enclosing tubular structures such as pipe elbows and manifolds. As such, fluids will not necessarily follow the curvature of the tubular structures, which may inhibit fluid flow and may introduce undesirable flow characteristics such as fluid hammer and cavitation. Conventional internal formations also may introduce structural weak points, stress concentrations, and inefficient or imperfect structural properties to the tubular structure.

SUMMARY

Embodiments of the present invention solve the above-mentioned problems and provide a distinct advance in the art of tubular structures and internal formations for tubular structures. More particularly, the present invention provides a computer modeling and additive manufacturing system for creating internal formations that conform to the curvature of tubular structures.

An embodiment of the present invention is a method of creating an internal formation of a tubular structure that includes generating a finite element mesh corresponding to a curvature of the tubular structure; generating or receiving a lattice cellular component via computer-aided design software; generating a lattice structure based on the lattice cellular component; and modifying the lattice structure to conform to the finite element mesh so as to follow the curvature of an inner surface of an outer wall of the tubular structure. In this way, the lattice structure will guide fluid through curves of the tubular structure and will not inhibit fluid flow therethrough.

Another embodiment of the present invention is a system for creating an internal formation of a tubular structure having an inner surface via additive manufacturing. The system broadly comprises a computer modeling system and an additive manufacturing system. The computer modeling system may include a processor for generating a finite element mesh corresponding to a curvature of the tubular structure and generating a lattice cellular component via computer-aided design software according to inputs received from a user. The processor may also generate a lattice structure based on the lattice cellular component and modify the lattice structure to conform to the finite element mesh so as to follow the curvature of the inner surface of the outer wall of the tubular structure. The additive manufacturing system is configured to produce the lattice structure via additive manufacturing material deposited layer by layer according to the lattice structure. In this way, complex internal structures can be formed that would not be able to be created via conventional manufacturing systems.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

The drawing figures do not limit the present invention to the specific embodiments disclosed and described herein.

The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Turning to the drawing figures, and particularly FIGS. 1-4, a computer modeling and additive manufacturing system 10 constructed in accordance with an embodiment of the present invention is illustrated. The computer modeling and additive manufacturing system 10 broadly comprises a computer aided design (CAD) system 12 and an additive manufacturing system 14.

Figure 1:
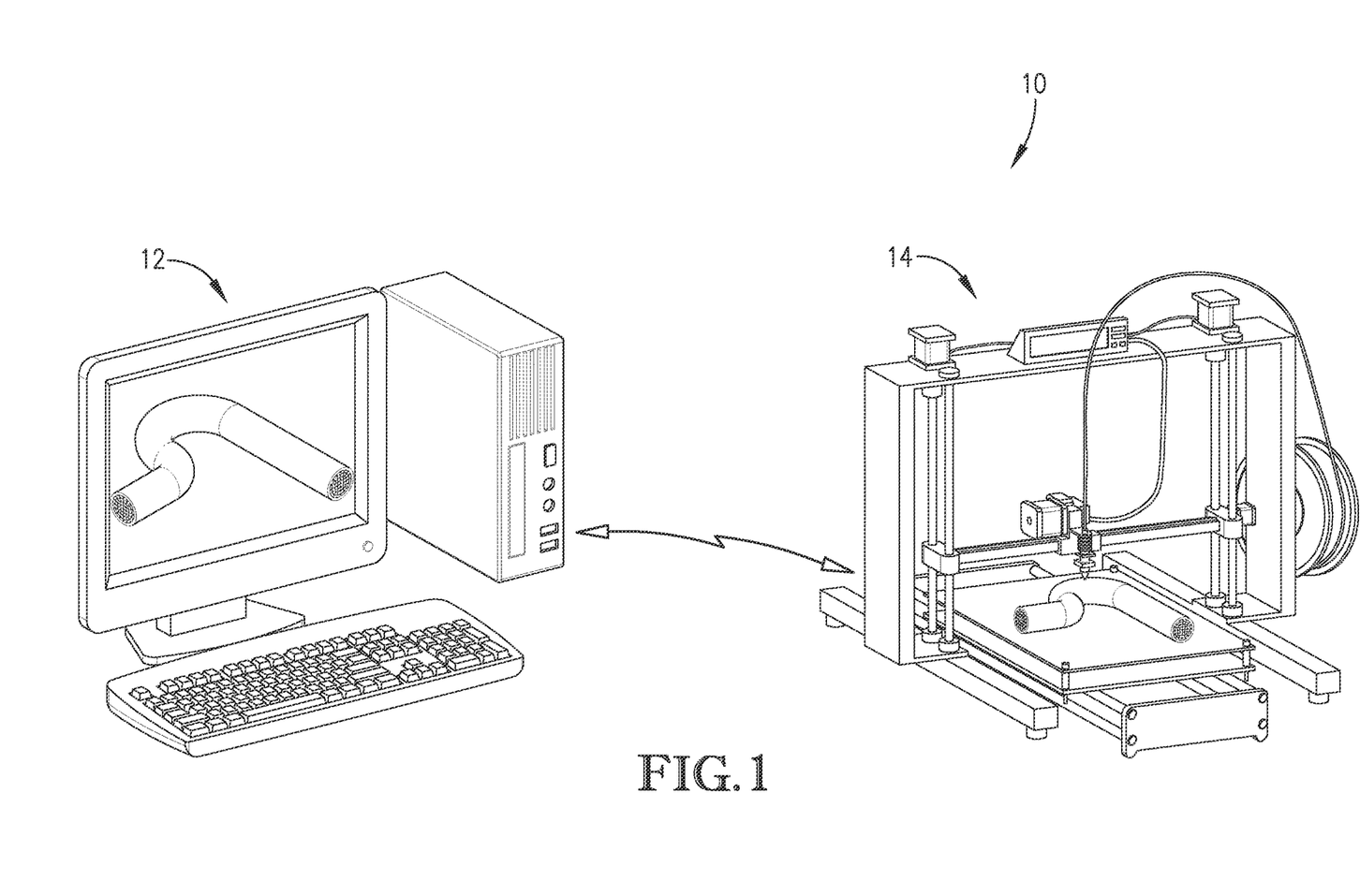
FIG. 1 is a perspective view of a computer modeling and additive manufacturing system constructed in accordance with an embodiment of the present invention.
Figure 2:
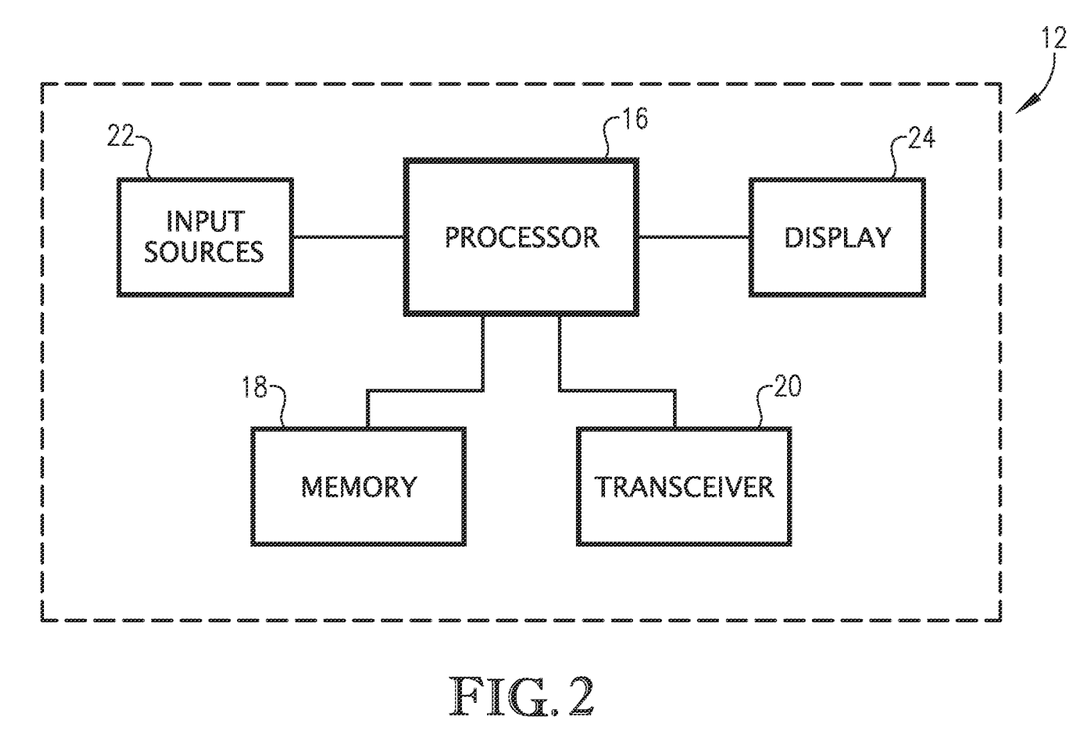
FIG. 2 is a schematic view of the computer modeling system of FIG. 1.

The CAD system 12 may be used for designing and generating a computer model of a part 100 (comprising a tubular structure 200 and internal components 102 forming an internal lattice structure 104) and broadly includes a processor 16, a memory 18, a transceiver 20, a plurality of inputs 22, and a display 24. The CAD system 12 may be integral with or separate from the additive manufacturing system 14.

The processor 16 generates the computer model of the part 100 according to inputs and data received from a user. The processor 16 may include a circuit board, memory, display, inputs, and/or other electronic components such as a transceiver or external connection for communicating with external computers and the like.

The processor 16 may implement aspects of the present invention with one or more computer programs stored in or on computer-readable medium residing on or accessible by the processor. Each computer program preferably comprises an ordered listing of executable instructions for implementing logical functions in the processor 16. Each computer program can be embodied in any non-transitory computer-readable medium, such as the memory 18 (described below), for use by or in connection with an instruction execution system, apparatus, or device, such as a computer-based system, processor-containing system, or other system that can fetch the instructions from the instruction execution system, apparatus, or device, and execute the instructions.

The memory 18 may be any computer-readable non-transitory medium that can store the program for use by or in connection with the instruction execution system, apparatus, or device. The computer-readable medium can be, for example, but not limited to, an electronic, magnetic, optical, electro-magnetic, infrared, or semi-conductor system, apparatus, or device. More specific, although not inclusive, examples of the computer-readable medium would include the following: an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CDROM).

The transceiver 20 may transmit data and instructions between the CAD system 12 and the additive manufacturing system 14. Alternatively, a wired or integrated setup may be used between the CAD system 12 and the additive manufacturing system 14.

The inputs 22 allow a user to design and modify a model of the part 100 and may comprise a keyboard, mouse, trackball, touchscreen, buttons, dials, virtual inputs, and/or a virtual reality simulator. The inputs 22 may also be used to control or instruct the additive manufacturing system 14.

The display 24 may display a two-dimensional or three-dimensional representation of the model and may also display model data, computer options, and other information via a graphical user interface (GUI). The display 24 may be separate from or integrated with the additive manufacturing system 14.

Figure 3:
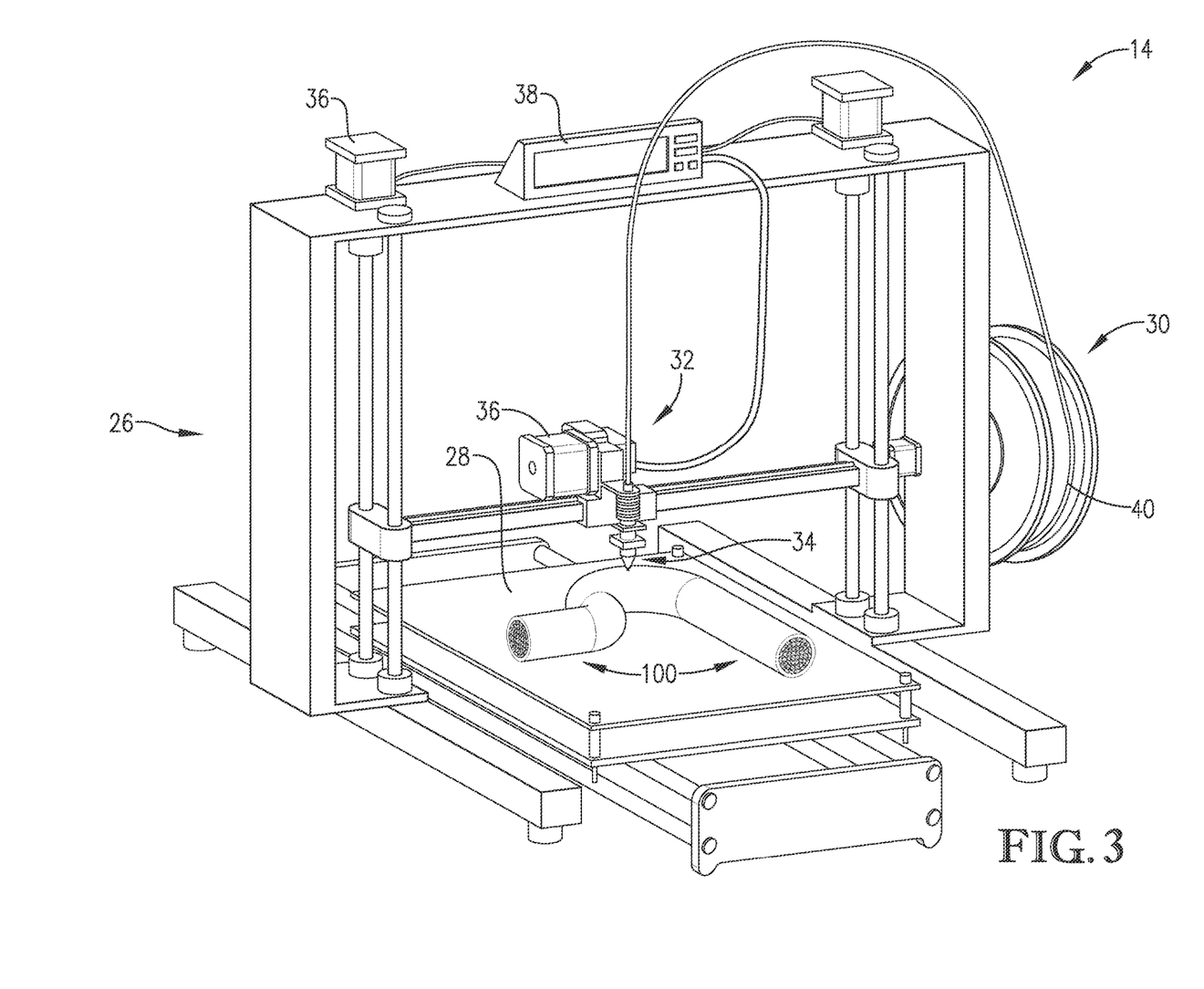
FIG. 3 is a perspective view of the additive manufacturing system of FIG. 1.

The additive manufacturing system 14 produces prototypes and parts such as part 100 and broadly includes a frame 26, a support surface 28, a material reserve 30, a feeder 32, a material applicator 34, a set of motors 36, and a processor 38. The additive manufacturing system 14 may be integral with or separate from the powder coating system 14.

The frame 26 provides structure for the support surface 28, material reserve 30, feeder 32, material applicator 34, motors 36, and/or the processor 38 and may include a base, vertical members, cross members, and mounting points for mounting the above components thereto. Alternatively, the frame 26 may be a walled housing or similar structure.

The support surface 28 supports the part 100 as it is being constructed and may be a stationary or movable flat tray or bed, a substrate, a mandrel, a wheel, scaffolding, or similar support. The support surface 28 may be integral with the additive manufacturing system 14 or may be removable and transferable with the part 100 as the part 100 is being constructed.

The material reserve 30 retains additive manufacturing material 40 and may be a hopper, tank, cartridge, container, spool, or other similar material holder. The material reserve may be integral with the additive manufacturing system 14 or may be disposable and/or reusable.

The additive manufacturing material 40 may be used for forming part 100 and may be in pellet or powder form, filament or spooled form, or any other suitable form. The additive manufacturing material 40 may be any plastic, polymer, or organic material suitable for use in additive manufacturing. For example, the additive manufacturing material 40 may be acrylonitrile butadiene styrene (ABS), polyamide, straw-based plastic, or other similar material.

The feeder 32 directs the additive manufacturing material 40 to the material applicator 34 and may be a spool feeder, a pump, an auger, or any other suitable feeder. Alternatively, the additive manufacturing material 40 may be gravity fed to the material applicator 34.

The material applicator 34 deposits the additive manufacturing material 40 onto the support surface 28 and previously constructed layers. The material applicator 34 may include a nozzle, guide, sprayer, or other similar component for channeling the additive manufacturing material 40 and a laser, heater, or similar component for melting the additive manufacturing material and bonding (e.g., sintering) the additive manufacturing material onto a previously constructed layer. The material applicator 34 may be sized according to the size of the pellets, powder, or filament being deposited.

The motors 36 position the material applicator 34 over the support surface 28 and previously constructed layers and move the material applicator 34 as the additive manufacturing material is deposited onto the support surface 28 and the previously constructed layers. The motors 36 may be oriented orthogonally to each other so that a first one of the motors 36 is configured to move the material applicator 34 in a lateral "x" direction, a second one of the motors 36 is configured to move the material applicator 34 in a longitudinal "y" direction, and a third one of the motors 36 is configured to move the material applicator 34 in an altitudinal "z" direction. Alternatively, the motors 36 may move the support surface 28 (and hence the part 100) while the material applicator 34 remains stationary.

The processor 38 directs the material applicator 34 via the motors 36 and activates the material applicator 34 such that the material applicator 34 deposits the additive manufacturing material 40 onto the support surface 28 and previously constructed layers according to a computer aided design of the part. The processor 38 may include a circuit board, memory, display, inputs, and/or other electronic components such as a transceiver or external connection for communicating with the processor 16 of the CAD system 12 and other external computers. It will be understood that the processor 38 may be one and the same as processor 16 of the CAD system 12.

The processor 38 may implement aspects of the present invention with one or more computer programs stored in or on computer-readable medium residing on or accessible by the processor. Each computer program preferably comprises an ordered listing of executable instructions for implementing logical functions in the processor 38. Each computer program can be embodied in any non-transitory computer-readable medium for use by or in connection with an instruction execution system, apparatus, or device, such as a computer-based system, processor-containing system, or other system that can fetch the instructions from the instruction execution system, apparatus, or device, and execute the instructions. In the context of this application, a "computer-readable medium" can be any non-transitory means that can store the program for use by or in connection with the instruction execution system, apparatus, or device. The computer-readable medium can be, for example, but not limited to, an electronic, magnetic, optical, electro-magnetic, infrared, or semi-conductor system, apparatus, or device. More specific, although not inclusive, examples of the computer-readable medium would include the following: an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CDROM).

It will be understood that the additive manufacturing system 14 may be any type of additive manufacturing or "3D printing" system such as a sintering, laser melting, laser sintering, extruding, fusing, stereolithography, extrusion, light polymerizing, powder bed, wire additive, or laminated object manufacturing system. The additive manufacturing system 14 may also be a hybrid system that combines additive manufacturing with molding, scaffolding, and/or other subtractive manufacturing or assembly techniques.

Use of the computer modeling and additive manufacturing system 10 for creating a computer model of the part 100 and forming the part 100 via additive manufacturing according to the computer model will now be described in more detail. First, a computer-aided design of a tubular structure 200 may be received or generated, in which an overall shape of the tubular structure 200 may be created. This may be a wire-frame model, surface model, solid model, or any other suitable CAD model that defines or exhibits the overall shape of the tubular structure 200.

Figure 4:
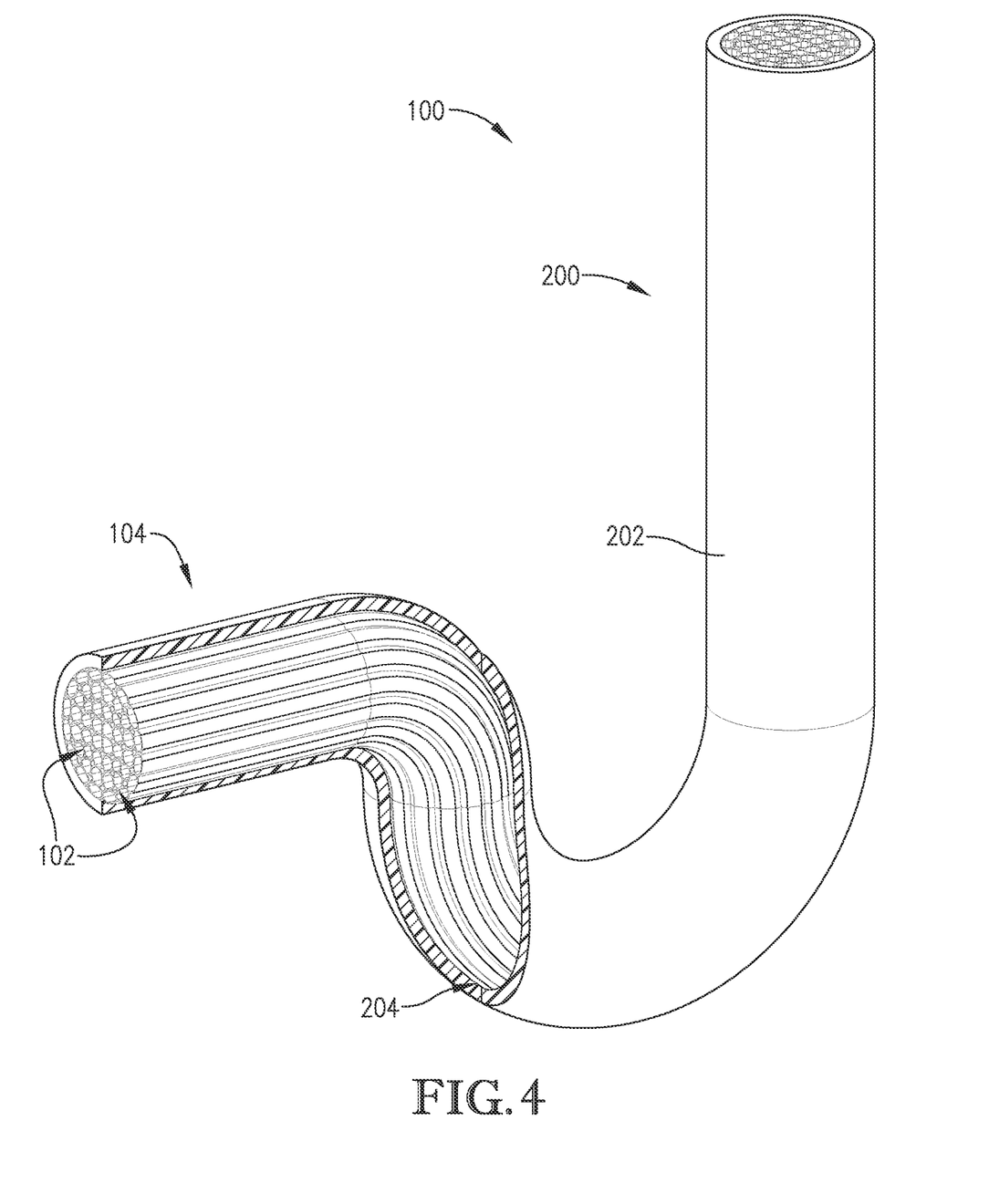
FIG. 4 is a perspective partial cutaway view of a tubular structure including an internal formation conforming to a curvature of the tubular structure and formed via additive manufacturing in accordance with an embodiment of the present invention.
Figure 5:
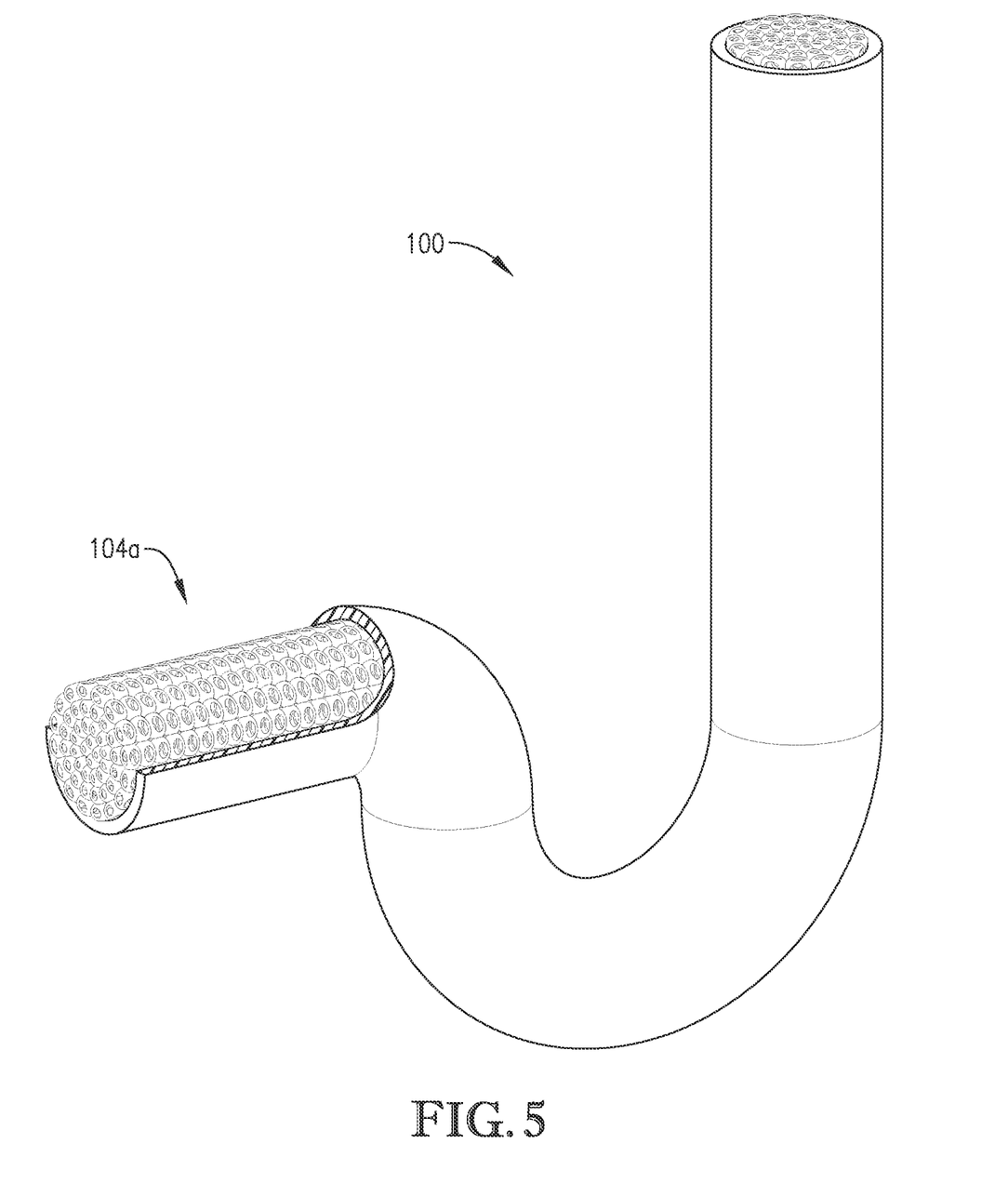
FIG. 5 is a perspective partial cutaway view of a tubular structure including an internal formation conforming to a curvature of the tubular structure and formed via additive manufacturing in accordance with another embodiment of the present invention.

The tubular structure 200 may include an outer wall 202 having an inner surface 204 partially or completely enclosing a central channel. The outer wall 202 may be a single piece of material or formed of two or more sections, as described in more detail below. The tubular structure 200 may have closed ends or may be open-ended. The tubular structure 200 may be a tube, pipe, duct, truss, structural beam, or other similar structure for guiding fluid flow and/or providing structural rigidity and support. To that end, the tubular structure 200 may have a cylindrical, rectangular, square, tapered, or other cross section. The overall shape of the tubular structure 200 may be optimized to reduce weight, increase strength, and improve fluid flow as desired.

The outer wall 202 may be curved so that the tubular structure 200 has a curvature corresponding to a curved axis as shown in FIG. 4. The curvature may serve to direct fluid flow, structural forces, or sound or other vibrations, or may be purely for aesthetics. For example, the tubular structure 200 may be a pipe elbow for directing flow of a gas or liquid around a corner.

Figure 9:
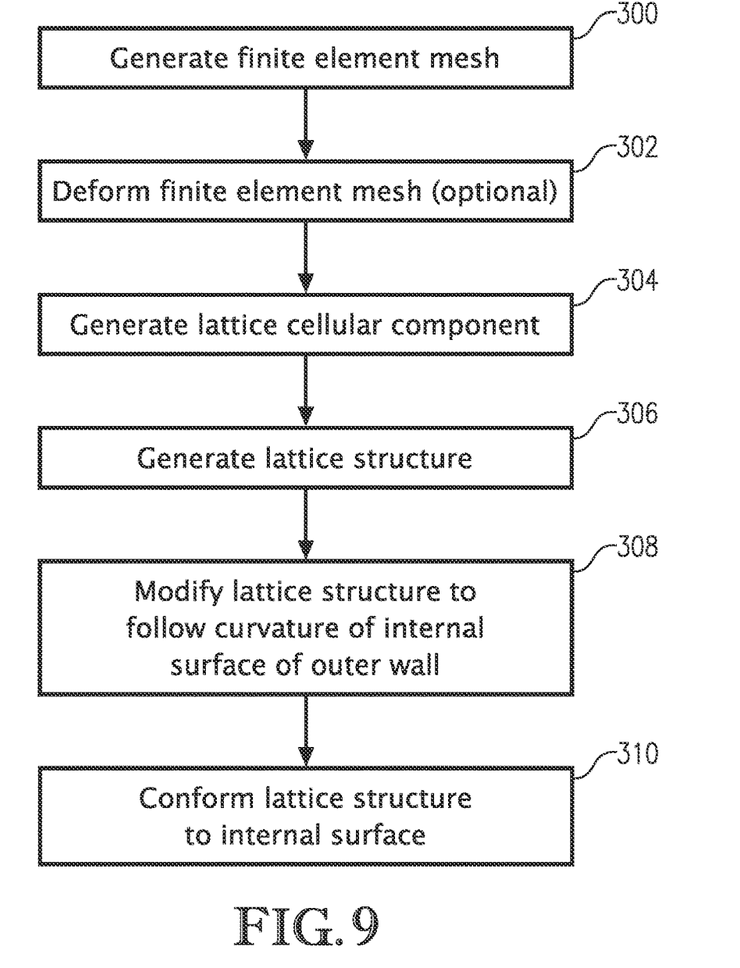
FIG. 9 is a flow diagram of a method of creating a design of one of the internal structures of FIGS. 4-8 via the computer modeling system of FIG. 2.

A finite element mesh may then be created, as shown in block 300. The finite element mesh may include a plurality of mesh elements each representing a deformable unit. Each mesh element may have a number of corner nodes, a number of edge midpoint nodes, face midpoint nodes, volume midpoint nodes, and/or any other nodes forming the basis of mesh element manipulation and deformation. For example, an 8-node hex will have corner nodes. A 20-node hex will have corner nodes and edge midpoint nodes. A 27-node hex will have corner nodes, edge midpoint nodes, face midpoint nodes, and a volume midpoint nodes. The finite element mesh may be a first order, second order, or higher order finite element mesh and may be triagonal, quadrilateral, tetrahedral, pyramidal, hexahedral, dodecahedral, or any other parameterizable polyhedral sub-volume shapes. The finite element mesh thus includes sub-volumes that provide spatial coordinates, as defined by the nodes for deformation processing. Higher order mesh elements can be used for higher order interpolation. Interpolation can be a free-form deformation, an isogeometric shape function, or an isoparametric shape function. The finite element mesh may include mesh elements of two or more base shapes such as central wedges near a central axis and flat-top pyramids surrounding the central wedges. The finite element mesh may be created to conform to and be compliant with the curvature or the overall shape of the tubular structure 200. However, the finite element mesh may undergo additional deformation, as described below.

The finite element mesh may optionally undergo smoothing, Jacobian optimization, Laplace optimization, regularity optimization, or other deformations, as shown in block 302. The finite element mesh may also be manually deformed or edited.

A lattice cellular component 102 may then be created, as shown in block 304. The lattice cellular component 102 may be a repeatable structural unit for populating the lattice structure 104 (described below) and may itself be a wireframe model, surface model, solid model, or any other suitable CAD model. The lattice cellular component 102 may have a shape that coincides with the shape of the mesh elements of the finite element mesh. For example, if the finite element mesh is quadrilateral, the lattice cellular component may also be quadrilateral and may extend to boundaries and/or nodes of a non-deformed mesh element. The lattice cellular component 102 may have any shape and may include truss members, cross members, frame-like members, or any other structural components and may have chamfers, fillets, recesses, arches, and complex curves. The lattice cellular component 102 may also include through-holes, channels, voids, chambers, and other negative spaces for allowing fluid to flow therethrough. For example, the lattice cellular component 102 may have extruded and non-extruded a honeycomb, square, tube, hexahedral, toroidial, or scaffold shapes, or any other suitable shape. The lattice cellular component 102 may be similar in shape to the tubular structure 200 but with a smaller diameter or other smaller dimensions.

Figure 6:
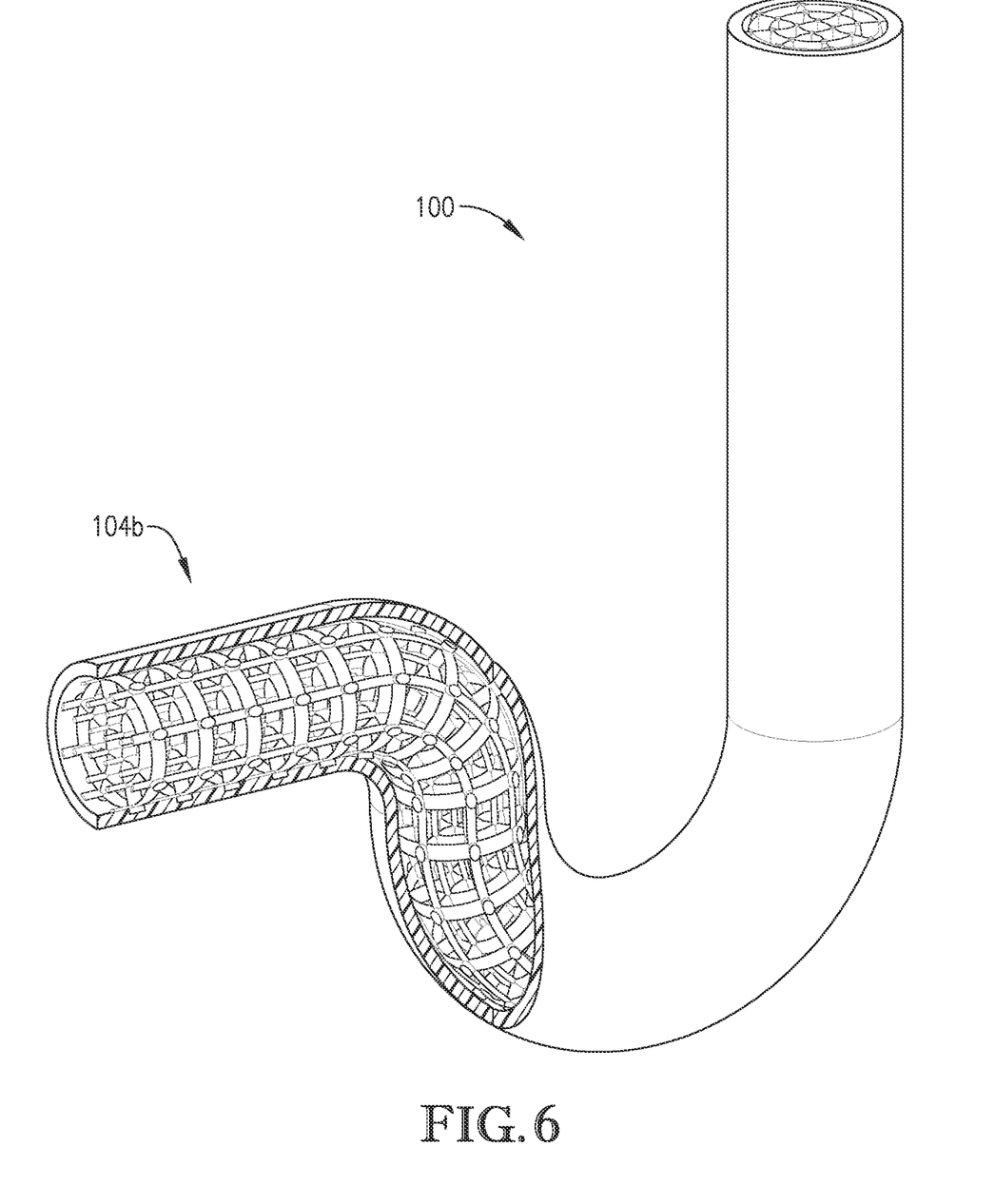
FIG. 6 is a perspective partial cutaway view of a tubular structure including an internal formation conforming to a curvature of the tubular structure and formed via additive manufacturing in accordance with yet another embodiment of the present invention.
Figure 7:
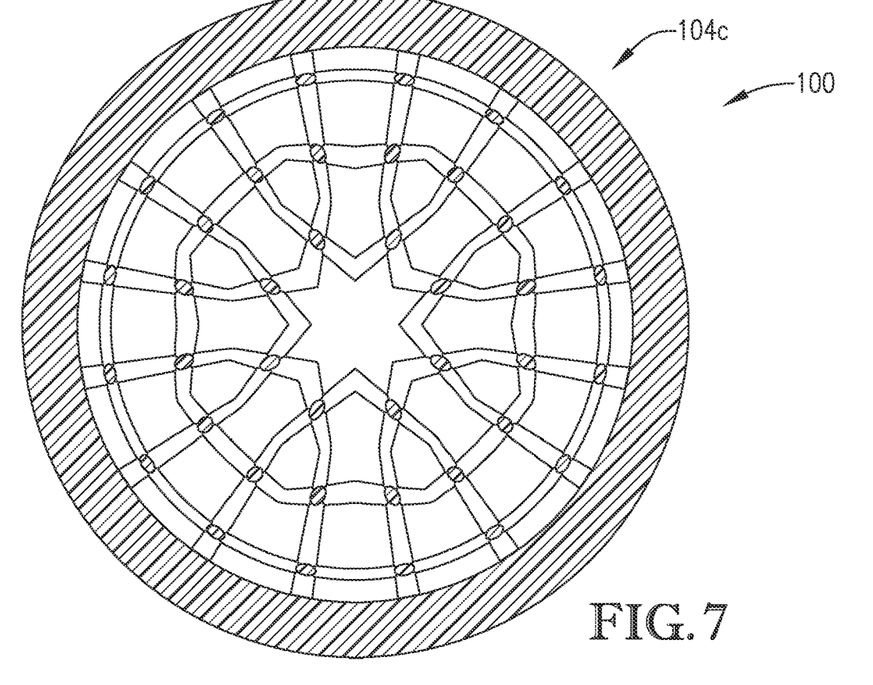
FIG. 7 is an end view of another internal formation conforming to an inner surface of a tubular structure.
Figure 8:
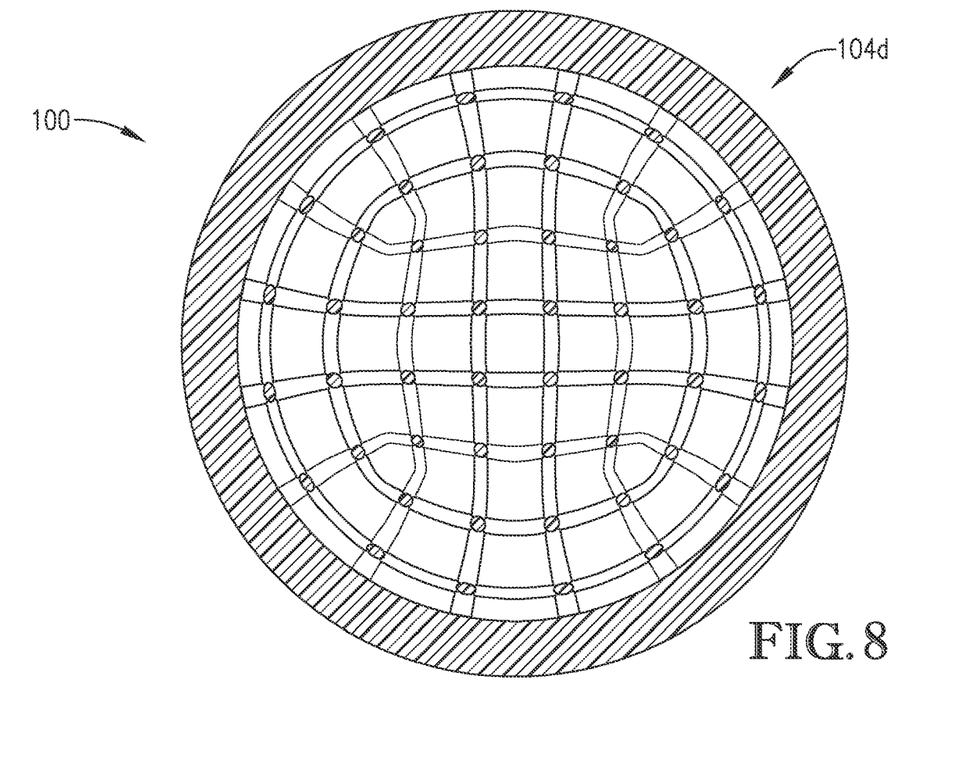
FIG. 8 is an end view of yet another internal formation conforming to an inner surface of a tubular structure.

The lattice structure 104 (i.e., the internal formation) based on the lattice cellular component 102 may then be generated, as shown in block 306. Each component in the lattice structure 104 may correspond to a mesh element of the finite element mesh. The lattice structure 104 may be a matrix, array, or network of repetitions or copies of the lattice cellular component 102. The lattice structure 104 may include a honeycomb pattern, tube pattern, hexahedral pattern, toroidial pattern, randomized pattern, or any other pattern (see lattice structure 104 of FIG. 4 and other lattice structures 104a-d of FIGS. 5-8). The pattern may extend along one or more axes and may include axially-extending members (FIGS. 4 and 6) and/or radially-extending members (FIG. 6). The lattice cellular components may be arranged end-to-end and/or laterally side by side (FIG. 5) and may be radially symmetrical (FIGS. 5-8). In one embodiment, the lattice structure 104 may include lattice cellular components of two or more different basic shapes.

The lattice structure 104 may then be modified to conform to the deformed finite element mesh such that the lattice structure 104 has a cellular periodicity corresponding to the mesh elements of the finite element mesh. That is, the lattice structure 104 may be modified to follow a curvature of an inner surface 204 of the outer wall 202 of the tubular structure 200, as shown in block 308.

The lattice structure 104 may be sampled at various points along its surface or within its volume. The surface may be faceted, where each facet may be a polygon including vertices and edges. This faceted form may be stored as a stereolithography (STL) file, Polygon file (PLY) file, Additive Manufacturing file (AMF), or as a finite element mesh. The vertices then provide spatial coordinates for evaluating the deformed mesh elements or lattice cellular components. Deformation of each lattice cellular component may include rotation and translation, in addition to stretching and skewing. That is, a lattice cellular component may undergo global deformation without undergoing local deformation.

The lattice structure 104 may then be modified or shaped to conform to the inner surface 204 of the outer wall 202 of the tubular structure 200, as shown in block 310. That is, outer radial extents of the lattice structure 104 may be made to join to or abut the inner surface 204 (best seen in FIGS. 4 and 6-8).

Figure 10:
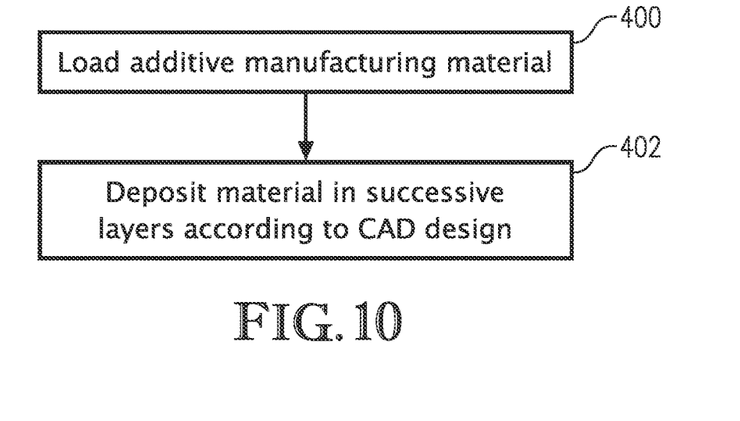
FIG. 10 is a flow diagram of a method of forming one of the internal structures of FIGS. 4-8 via the additive manufacturing system of FIG. 3.

The lattice structure 104 and the tubular structure 200 may then be created via the additive manufacturing system 14, as shown in FIG. 3. First, the additive manufacturing material may be inserted in or positioned on the material reserve 30 of the additive manufacturing system 14, as shown in block 400. For example, a spool of the additive manufacturing material 40 may be loaded onto the additive manufacturing system 14. The additive manufacturing material 40 may be any plastic, polymer, foam, or other additive manufacturing substance and may be fed in pellet, spool, or other form.

The additive manufacturing material 40 may then be deposited onto the support surface 28 via the material applicator 34 in successive layers according to the computer-aided design of the lattice structure 104 and/or the tubular structure 200, as shown in block 402. To that end, activation of horizontally oriented motors in various amounts allows for diagonal movement and curved movement of the material applicator 34. Activation of a vertically oriented motor may be used for relocating the material applicator 34 without depositing material and/or raising the material applicator 34 for creation of a new layer (see motors 36, above).

The lattice structure 104 may be formed with the tubular structure 200 so that the lattice structure 104 and the outer wall 202 of the tubular structure 200 are an integrated unitary piece of material or may be formed into a separately-formed or pre-formed tubular structure 200 of the same or different materials. For example, the lattice structure 104 and the tubular structure 200 may be formed via multi-material additive manufacturing or via joining in which the outer wall 202 of the tubular structure 200 comprises at least two sections. The lattice structure 104 may be positioned between the at least two sections of the outer wall 202, which are then connected or "joined" via welding, soldering, clamps, press fits, or similar mechanisms. The lattice structure 104 may thus be press fit or otherwise retained between the at least two section of the outer wall 202. In this way, the part 100 may have a ceramic lattice structure and a metallic outer layer or any other combination of materials.

It will be understood that the above-described steps may be performed in any order, including simultaneously. In addition, some of the steps may be repeated, duplicated, and/or omitted without departing from the scope of the present invention.

The above-described computer modeling and additive manufacturing system 10 and method provide several advantages over conventional systems. For example, the lattice structure 104 guides fluids in accordance with the curvature of the tubular structure 200, which reduces undesirable flow characteristics such as fluid hammer and cavitation. The lattice structure 104 also maintains consistent flow areas and flow paths through curves of the tubular structure 200 such that fluid flow is not restricted or misdirected within or near the curves of the tubular structure 200. Features of the lattice structure 104 are not cut or compromised to fit the curvature of the tubular structure 200, which reduces or eliminates structural weak points, stress concentrations, and inefficient or imperfect structural properties along the curves of the tubular structure 200.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A system for creating an internal formation of a tubular structure having an outer wall including an inner surface via additive manufacturing, the system comprising:
   a computer modeling system comprising:
      a processor configured to:
         generate a finite element mesh corresponding to a curvature of the inner surface of the outer wall of the tubular structure;
         generate a lattice cellular component via computer-aided design software according to inputs received from a user;
         generate a lattice structure based on the lattice cellular component; and
         modify the lattice structure to have a cellular periodicity corresponding to mesh elements of the finite element mesh so that the lattice structure follows the curvature of the inner surface; and
   an additive manufacturing system configured to produce the internal formation via additive manufacturing material deposited layer by layer according to the lattice structure, the additive manufacturing system comprising:
      a material reserve configured to receive a first additive manufacturing material and separately receive a second additive manufacturing material different than the first additive manufacturing material; and
      a material applicator configured to:
         selectively deposit the first additive manufacturing material from the material reserve onto a support surface in successive layers to form an outer wall including an inner surface having a longitudinal curvature; and
         selectively deposit the second additive manufacturing material from the material reserve onto the support surface in successive layers to form a lattice structure including a plurality of tubes according to data representative of the lattice structure and having global deformations such that the plurality of tubes follow the longitudinal curvature of the inner surface and such that the plurality of tubes forming outer extents of the lattice structure abut the inner surface of the outer wall without being compromised so as to conform the lattice structure to the inner surface of the outer wall,
      wherein the plurality of tubes are configured to guide fluids through the tubular structure in accordance with the longitudinal curvature of the inner surface.

2. The system of claim 1, wherein the lattice structure is radially symmetrical.

3. The system of claim 1, wherein the plurality of tubes are configured to maintain consistent flow areas and flow paths through and along the plurality of tubes.

4. The system of claim 1, wherein the plurality of tubes have a plurality of cross-sectional shapes.

5. The system of claim 1, wherein the lattice structure is formed of a foam material.

6. The system of claim 1, wherein the outer wall and the plurality of tubes are longitudinally curved in at least two directions.

7. The system of claim 1, wherein the lattice structure includes an axial pattern such that the lattice structure comprises a plurality of lattice cellular components arranged end-to-end.

8. The system of claim 1, wherein the lattice structure includes a lateral pattern such that the lattice structure comprises a plurality of lattice cellular components arranged side-by-side.

9. The system of claim 1, wherein the lattice structure comprises an extruded pattern.

10. The system of claim 1, wherein the lattice structure comprises a plurality of inner tubes, each inner tube being smaller in diameter than the inner surface of the outer wall.

11. A system for creating an internal formation of a tubular structure having an outer wall including an inner surface via additive manufacturing, the system comprising:
   a computer modeling system comprising:
      a processor configured to:
         generate a finite element mesh corresponding to a curvature of the inner surface of the outer wall of the tubular structure;
         generate a lattice cellular component via computer-aided design software according to inputs received from a user;
         generate a lattice structure based on the lattice cellular component; and
         modify the lattice structure to have a cellular periodicity corresponding to mesh elements of the finite element mesh so that the lattice structure follows the curvature of the inner surface;
      a non-transitory computer-readable memory configured to store the lattice cellular component and the lattice structure thereon;
      a transceiver for communicating with other devices over a wireless communication network;
      a plurality of inputs for receiving the inputs of the user; and
      a display configured to visually produce a model of the lattice structure; and
   an additive manufacturing system configured to produce the internal formation via additive manufacturing material deposited layer by layer according to the lattice structure, the additive manufacturing system comprising:
      a material reserve configured to receive a spool of a first additive manufacturing material and separately receive a spool of a second additive manufacturing material different than the first additive manufacturing material; and
      a material applicator configured to:
         selectively deposit the first additive manufacturing material from the first material reserve onto a support surface in successive layers to form an outer wall including an inner surface having a longitudinal curvature; and
         selectively deposit the second additive manufacturing material from the second material reserve onto the support surface in successive layers to form a lattice structure including a plurality of tubes according to data representative of the lattice structure and having global deformations such that the plurality of tubes follow the longitudinal curvature of the inner surface and such that the plurality of tubes forming outer extents of the lattice structure abut the inner surface of the outer wall without being compromised so as to conform the lattice structure to the inner surface of the outer wall, the additive manufacturing system being further configured to join the lattice structure and the outer wall together,
wherein the plurality of tubes are configured to guide fluids through the tubular structure in accordance with the longitudinal curvature of the inner surface.

12. The system of claim 11, wherein the lattice structure is radially symmetrical.

13. The system of claim 11, wherein the plurality of tubes are configured to maintain consistent flow areas and flow paths through and along the plurality of tubes.

14. The system of claim 11, wherein the plurality of tubes have a plurality of cross-sectional shapes.

15. The system of claim 11, wherein the lattice structure is formed of a foam material.

16. The system of claim 11, wherein the outer wall and the plurality of tubes are longitudinally curved in at least two directions.

17. The system of claim 11, wherein the lattice structure includes an axial pattern such that the lattice structure comprises a plurality of lattice cellular components arranged end-to-end.

18. The system of claim 11, wherein the lattice structure includes a lateral pattern such that the lattice structure comprises a plurality of lattice cellular components arranged side-by-side.

19. The system of claim 11, wherein the lattice structure comprises an extruded pattern.

20. The system of claim 11, wherein the lattice structure comprises a plurality of inner tubes, each inner tube being smaller in diameter than the inner surface of the outer wall.

* * * * *